(12) United States Patent
Yu et al.

(10) Patent No.: US 10,599,185 B2
(45) Date of Patent: Mar. 24, 2020

(54) ROLLABLE FLEXIBLE DISPLAY DEVICE

(71) Applicant: LG Display Co., Ltd., Seoul (KR)

(72) Inventors: Sangho Yu, Paju-si (KR); Seungtae Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 43 days.

(21) Appl. No.: 15/662,694

(22) Filed: Jul. 28, 2017

(65) Prior Publication Data
US 2018/0032106 A1    Feb. 1, 2018

(30) Foreign Application Priority Data

Jul. 29, 2016  (KR) .................. 10-2016-0097480

(51) Int. Cl.
| | | |
|---|---|---|
| *G06F 1/16* | (2006.01) | |
| *G09F 9/30* | (2006.01) | |
| *H04M 1/02* | (2006.01) | |
| *H01L 51/00* | (2006.01) | |

(52) U.S. Cl.
CPC ............ *G06F 1/1652* (2013.01); *G09F 9/301* (2013.01); *H04M 1/0268* (2013.01); *G06F 2203/04102* (2013.01); *H01L 51/0097* (2013.01); *H01L 2251/5338* (2013.01)

(58) Field of Classification Search
CPC .......................... G06F 1/1652; H04M 1/0268
USPC .................................. 361/379, 349
See application file for complete search history.

(56) References Cited

U.S. PATENT DOCUMENTS

| | | | | |
|---|---|---|---|---|
| 2001/0012453 A1* | 8/2001 | Nishitani | .............. | G03B 17/24 396/319 |
| 2013/0008618 A1* | 1/2013 | Hall | ...................... | H02P 7/2913 160/138 |
| 2013/0127917 A1* | 5/2013 | Kwack | .................. | G06F 1/1652 345/660 |
| 2014/0029017 A1* | 1/2014 | Lee | ........................ | G01B 11/24 356/601 |
| 2016/0307545 A1* | 10/2016 | Lee | .......................... | G09G 5/38 |
| 2017/0140504 A1* | 5/2017 | Jeong | .................... | G06F 1/1677 |
| 2018/0150111 A1* | 5/2018 | Kim | ........................ | G06F 1/1652 |
| 2018/0217679 A1* | 8/2018 | Kwon | ................. | G06F 3/04883 |

* cited by examiner

*Primary Examiner* — Christopher E Mahoney
(74) *Attorney, Agent, or Firm* — Polsinelli PC

(57) ABSTRACT

The present disclosure provides a rollable flexible display device. The rollable flexible display device including a display panel that displays an image and rolls or unrolls like a scroll, a sensing circuit that performs sensing to detect rolled and unrolled portions of the display panel and outputs sensed values, and a device adjusting part that adjusts the operating conditions of the display panel based on the sensed values sent from the sensing circuit.

22 Claims, 20 Drawing Sheets

Fully unrolled state

70% unrolled state

Fully unrolled state

30% unrolled state

Fully unrolled state

50% unrolled state

Fig. 10
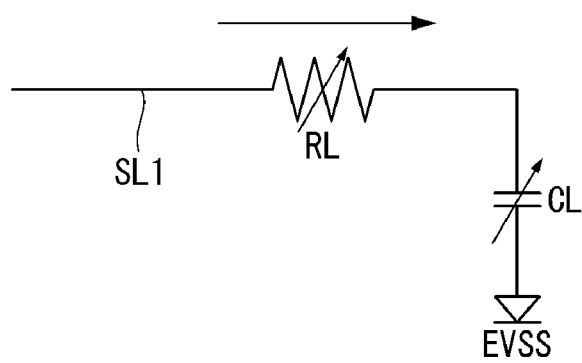
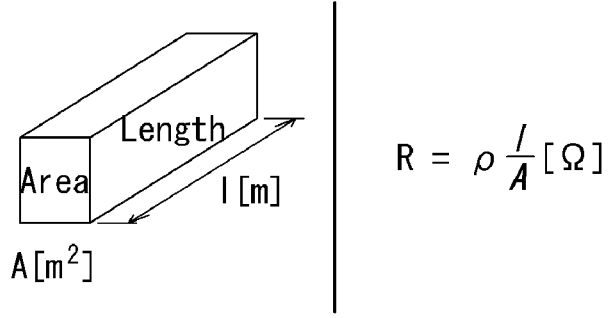
: Change in resistance caused by strain
→ Detect the area of rolled portion $$\begin{cases} R_{LF} \neq R_{LS} \\ C_{LF} \neq C_{LS} \end{cases}$$

ROLLABLE FLEXIBLE DISPLAY DEVICE

CROSS-REFERENCE TO RELATED APPLICATION

This application claims the priority benefit of Korean Patent Application No. 10-2016-0097480 filed on Jul. 29, 2016, which is hereby incorporated herein by reference in its entirety for all purposes as if fully set forth herein.

BACKGROUND

Field of the Disclosure

The present disclosure relates to a display device, and more particularly, to a rollable flexible display device.

The market for display devices which act as an intermediary between users and information is growing with the development of information technology. Thus, the display devices such as organic light-emitting displays (OLEDs), electrophoretic display devices (EDs), liquid crystal displays (LCDs), and plasma display panels (PDPs) are increasingly used.

A display device comprises a display panel comprising a plurality of subpixels, a drive part that drives the display panel, a control part that controls the drive part, and so on. The drive part comprises a scan driver that supplies a scan signal (or gate signal) to the display panel and a data driver that supplies a data signal to the display panel.

Some of the aforementioned displays, for example, the electrophoretic display devices or the organic light-emitting displays, can be manufactured with flexible materials. Thus, the display panel can be bent or curved, and at the same time its shape can be altered by rolling and unrolling like a scroll.

Shape of the display device shape can be altered by rolling and unrolling like a scroll, so it is called as a scrollable flexible display device or a rollable display device. There have been continuing researches into such display devices being conducted because of their wide applicability in many areas.

SUMMARY

The present disclosure provides a rollable flexible display device comprising: a display panel that displays an image and rolls or unrolls like a scroll; a sensing circuit that performs sensing to detect rolled and unrolled portions of the display panel and outputs sensed values; and a device adjusting part that adjusts the operating conditions of the display panel based on the sensed values sent from the sensing circuit.

BRIEF DESCRIPTION OF THE DRAWINGS

The accompanying drawings, which are included to provide a further understanding of the disclosure and are incorporated in and constitute a part of this disclosure, illustrate aspects of the disclosure and together with the description serve to explain the principles of the disclosure. In the drawings:

FIG. 10 is a diagram explaining a change in resistance caused by tensile strain;

DETAILED DESCRIPTION

Reference will now be made in detail to aspects of the disclosure, examples of which are illustrated in the accompanying drawings.

Hereinafter, a concrete example according to exemplary aspects of the present disclosure will be described with reference to the accompanying drawings.

An example of implementation of a rollable flexible display device according to an exemplary aspect will be described below with respect to an organic light-emitting display. However, the rollable flexible display device is not limited to this example since it can be implemented as an electrophoretic display device (DE), a liquid crystal display (LCD), etc.

Figure 1:
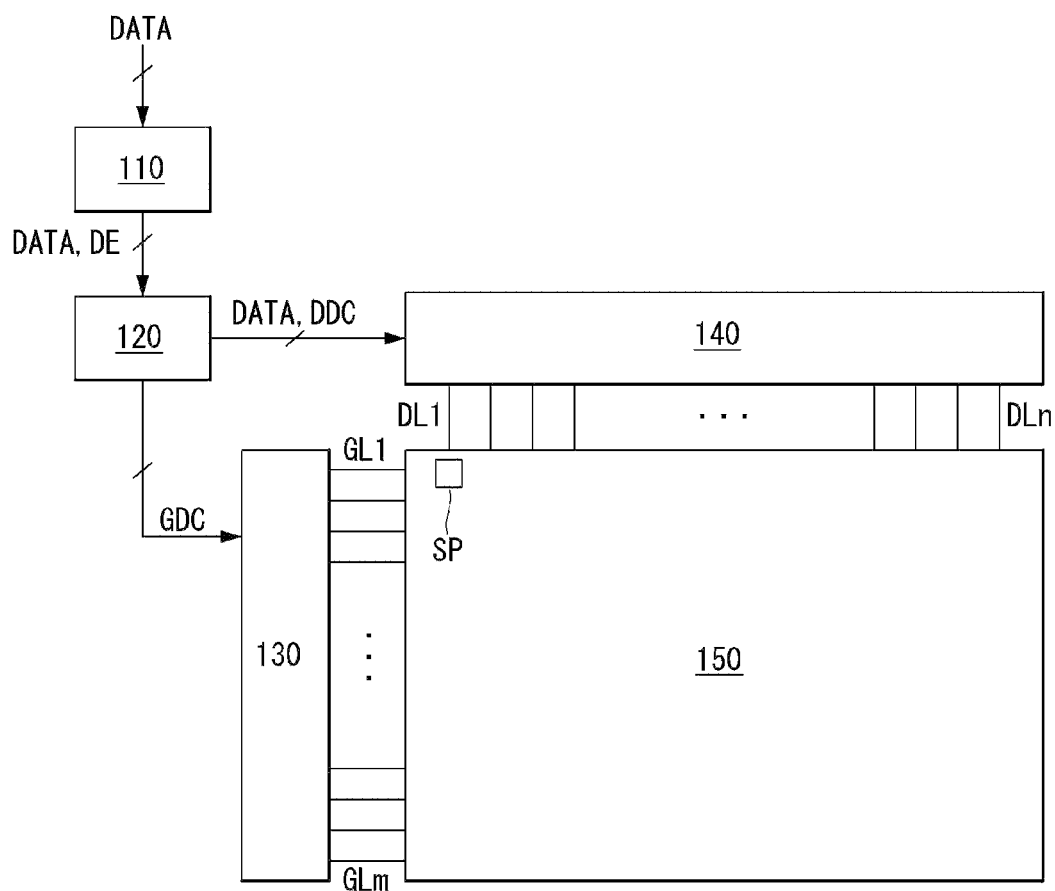
FIG. 1 is a schematic block diagram of an organic light-emitting display according to an exemplary aspect of the present disclosure.
Figure 2:
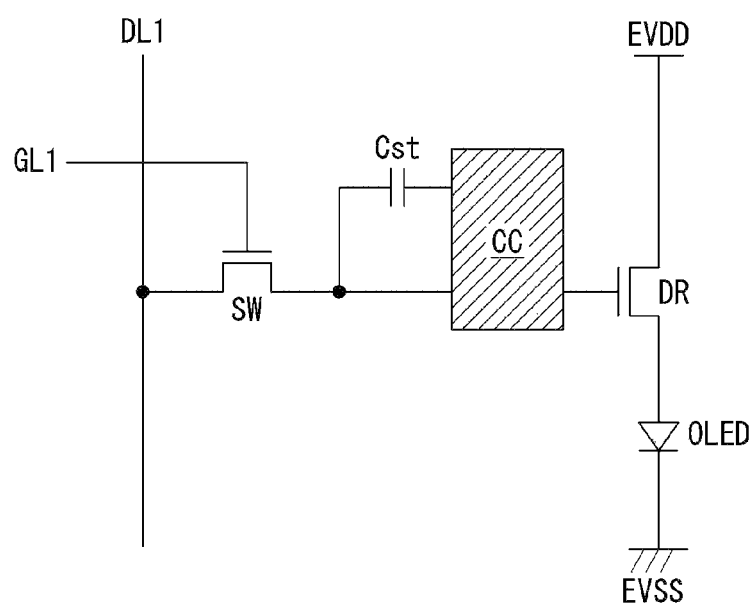
FIG. 2 is a schematic circuit diagram of a subpixel.
Figure 3:
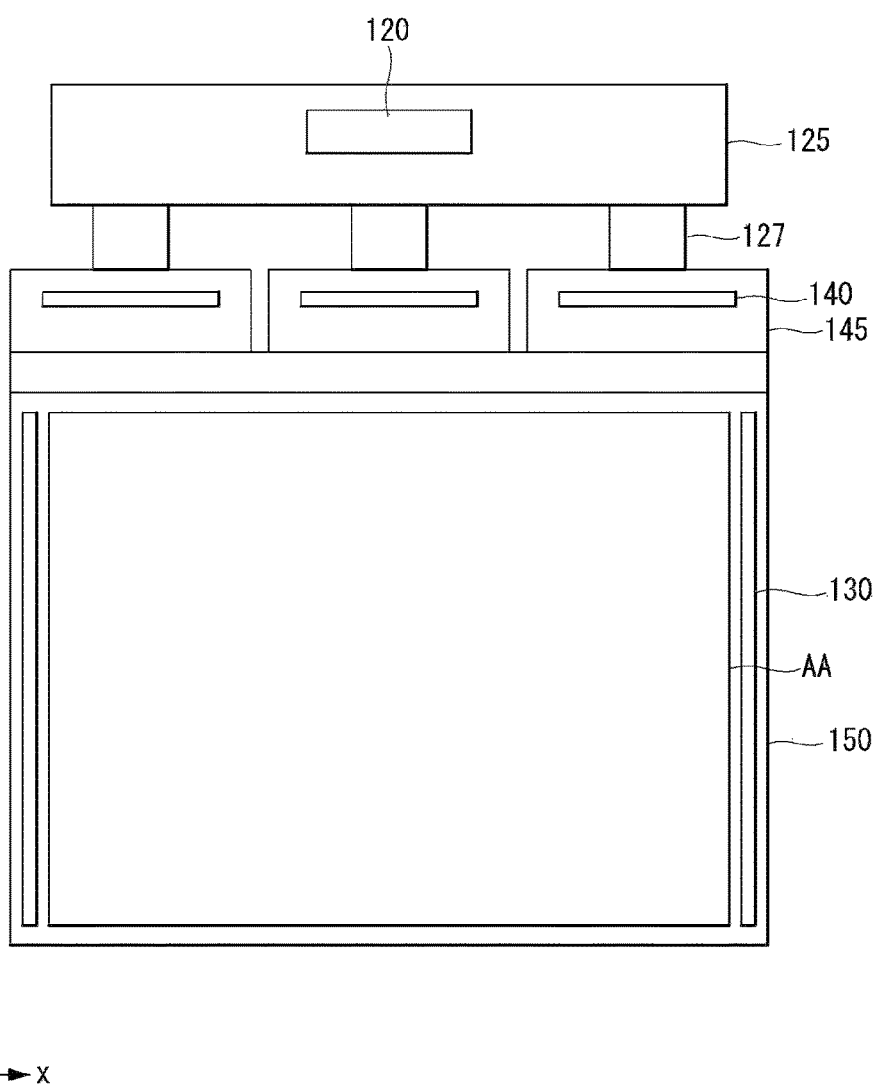
FIG. 3 is a plan view of a display panel and its neighboring devices connected in a modular way.

FIG. 1 is a schematic block diagram of an organic light-emitting display according to an exemplary aspect of the present disclosure. FIG. 2 is a schematic circuit diagram of a subpixel. FIG. 3 is a plan view of a display panel and its neighboring devices connected in a modular way.

As illustrated in FIG. 1, an organic light-emitting display according to an exemplary aspect of the present disclosure comprises an image processor 110, a timing controller 120, a data driver 140, a scan driver 130, and a display panel 150.

The image processor 110 outputs a data enable signal DE, etc., along with an externally supplied data signal DATA. In addition to the data enable signal DE, the image processor 110 may output one or more among a vertical synchronization signal, a horizontal synchronization signal, and a clock signal. But, these signals will be omitted in the drawings for convenience of explanation.

The timing controller 120 receives the data signal DATA from the image processor 110, along with the data enable signal DE or driving signals including the vertical synchronization signal, horizontal synchronization signal, and clock signal. The timing controller 120 outputs a gate timing control signal GDC for controlling the operation timing of the scan driver 130 and a data timing control signal DDC for controlling the operation timing of the data driver 140, based on the driving signals.

The data driver 140 samples and latches the data signal DATA supplied from the timing controller 120, in response to the data timing control signal DDC supplied from the timing controller 120, and converts this signal to a gamma reference voltage and outputs it. The data driver 140 outputs the data signal DATA through data lines DL1 to DLn. The data driver 140 may be provided in the form of an IC (integrated circuit).

The scan driver 130 outputs a scan signal while shifting the level of a gate voltage in response to the gate timing control signal GDC supplied from the timing controller 120. The scan driver 130 outputs a scan signal through scan lines GL1 to GLm. The scan driver 130 is provided in the form of an IC (integrated circuit), or provided on the display panel 150 in the form of a gate-in-panel.

The display panel 150 displays an image in response to the data signal DATA and scan signal respectively supplied from the data driver 140 and the scan driver 130. The display panel 150 comprises subpixels SP that work to display an image. The subpixels SP are formed on a bendable or flexible ductile substrate.

The subpixels SP may be a top-emission type, a bottom-emission type, or a dual-emission type according to their structure. The subpixels SP may comprise red subpixels, green subpixels, and blue subpixels, or may comprise white subpixels, red subpixels, green subpixels, and blue subpixels. The subpixels SP may have one or more different light-emission areas depending on the light-emission characteristics.

As illustrated in FIG. 2, one subpixel comprises a switching transistor SW, a driving transistor DR, a capacitor Cst, a compensation circuit CC, and an organic light-emitting diode OLED.

The switching transistor SW acts as a switch in response to a scan signal supplied through the first scan line GL1 to store a data signal supplied through the first data line DL1 as a data voltage in the capacitor Cst. The driving transistor DR works to cause a drive current to flow between a first power supply line EVDD and a second power supply line EVSS by storing the data voltage in the capacitor Cst. The organic light-emitting diode OLED works to emit light by the drive current formed by the driving transistor DR.

The compensation circuit CC is a circuit that is added within the subpixel to compensate for a threshold voltage, etc. of the driving transistor DR or degradation of the organic light-emitting diode OLED. The compensation circuit CC consists of one or more transistors. The configuration of the compensation circuit CC varies widely depending on the method of compensation, so a detailed description thereof will be omitted.

As illustrated in FIG. 3, the display panel 150 and its neighboring devices are connected in a modular way. The scan driver 130 is provided in the form of a gate-in-panel in a non-display area of the display panel 150. The data driver 140 is provided in the form of an IC and mounted on a source board 145. The timing controller 120 is provided in the form of an IC and mounted on a control board 125.

The scan driver 130 may be provided in the form of a gate-in-panel on the left side, right side or both sides of a display area AA so that the display panel 150 can be scrollable, but the present disclosure is not limited to this. Moreover, the data driver 140 may be mounted on a source board 145 composed of a flexible circuit board, and the timing controller 120, etc. may be mounted on a control board 125 composed of a printed circuit board, but the present disclosure is not limited to this. Additionally, the source board 145 and the control board 125 may be connected by a cable 127 by a connector method, but the present is not limited to this.

A mechanical structure for implementing a rollable flexible display device and implementation examples using the same will be described below.

Figure 4:
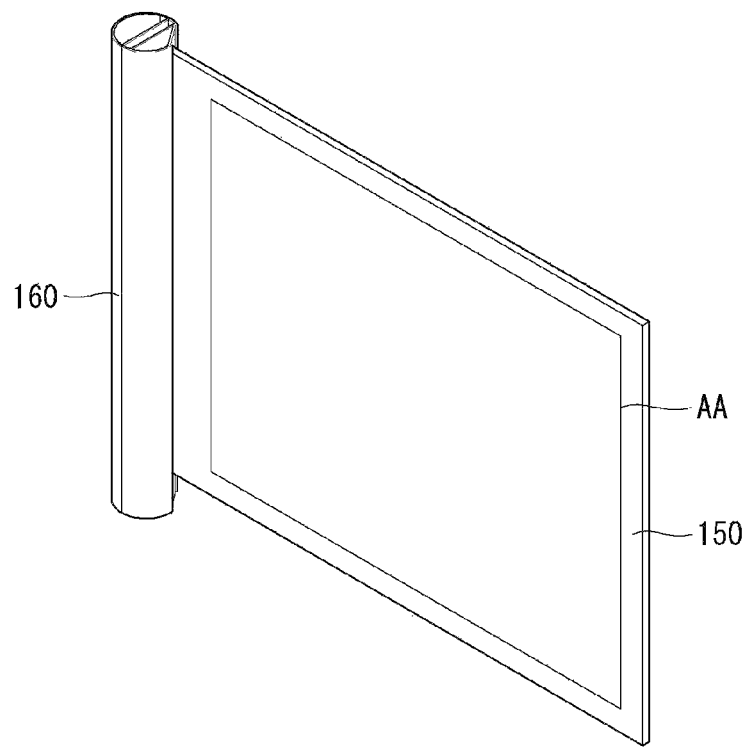
FIG. 4 is a schematic view showing a rollable flexible display device.

FIG. 4 is a view showing a rollable flexible display device. FIG. 5 is a schematic diagram explaining the concept of the rollable flexible display device. FIG. 6 is a view showing an aspect of the rollable flexible display device. FIG. 7 is a view showing another aspect of the rollable flexible display device. FIG. 8 is a view showing still another aspect of the rollable flexible display device.

Figure 5A:
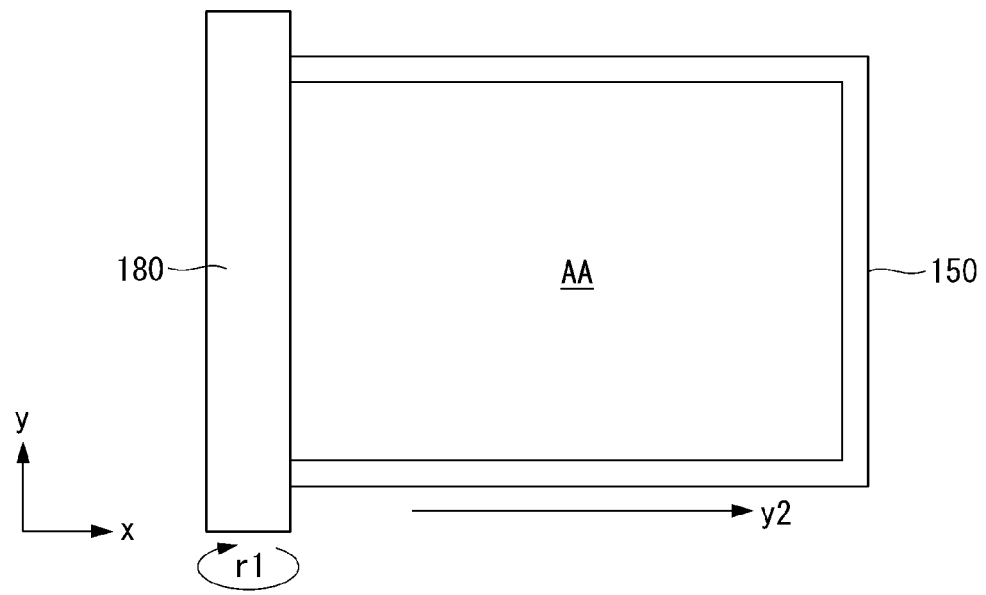
FIGS. 5A and 5B are schematic diagrams explaining the concept of the rollable flexible display device.
Figure 5B:
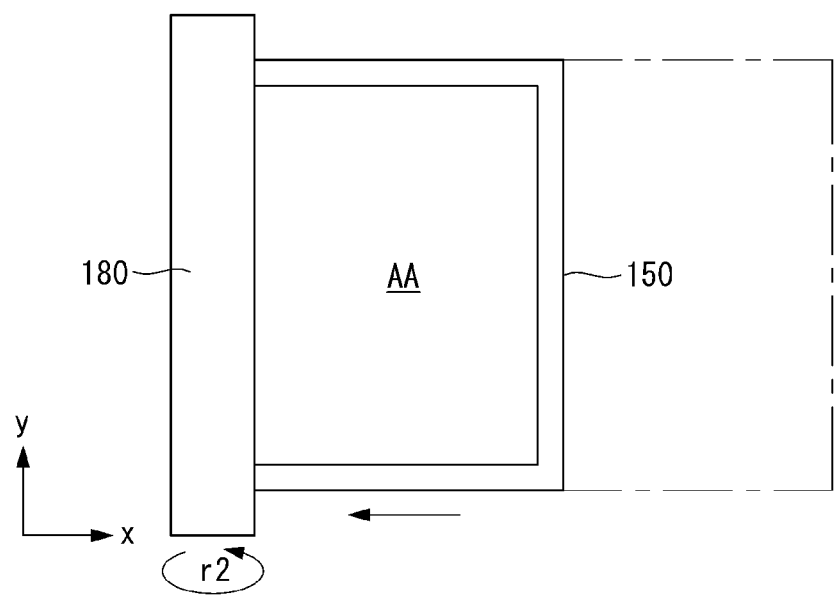

As illustrated in FIGS. 4, 5A, and 5B, the rollable flexible display device comprises a modularized display panel 150 (hereinafter, abbreviated as "display panel"), a panel roller part 160, and a housing 180.

The panel roller part 160 is cylindrical. The panel roller part 160 provides a mechanical structure that allows the display panel 150 to roll around its outer circumferential surface and unroll from it. The panel roller part 160 is contained in the housing 180 shown in FIGS. 5A and 5B.

The housing 180 can accommodate the display panel 150 and the panel roller part 160. A driving device, such as a motor, a gear, a power source, etc. for electrically rotating the panel roller part 160 may be included within the housing 180.

The housing 180 may be designed to be circular, elliptical, square, rectangular, or polygonal in shape according to the configuration or design of the driving device. Meanwhile, the panel roller part 160 may be rotated mechanically by a wheel or wind-up mechanism or manually by the user.

The display panel 150 comes out of the housing 180 or goes back into the housing 180 depending on the direction of rotation of the driving device.

For example, as shown in FIG. 5A, when the driving device rotates in the r1 direction, the panel roller part 160 rolls the display panel 150 rolled around its outer circumferential surface. In this case, the display panel 150 moves to the y2 direction and therefore comes out of the housing 180. By contrast, as shown in FIG. 5B, when the driving device rotates in the r2 direction, the panel roller part 160 rolls the display panel 150 around its outer circumferential surface. In this case, the display panel 150 moves to the y1 direction and therefore goes back into the housing 180.

Figure 6A:
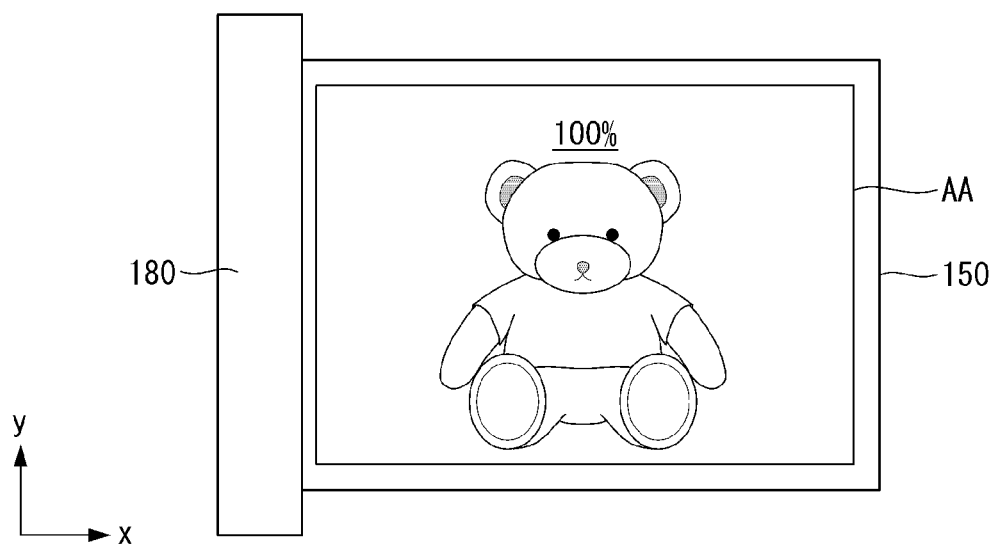
FIGS. 6A and 6B are views showing an aspect of the rollable flexible display device.

According to an aspect of the disclosure, the rollable flexible display device may vary or optimize the resolution, depending on the area (size or position) of the display panel 150 when unrolled. As illustrated in FIG. 6A, when the display panel 150 is fully unrolled, an image is displayed at the full resolution (high resolution) the display panel 150 can provide.

Figure 6B:
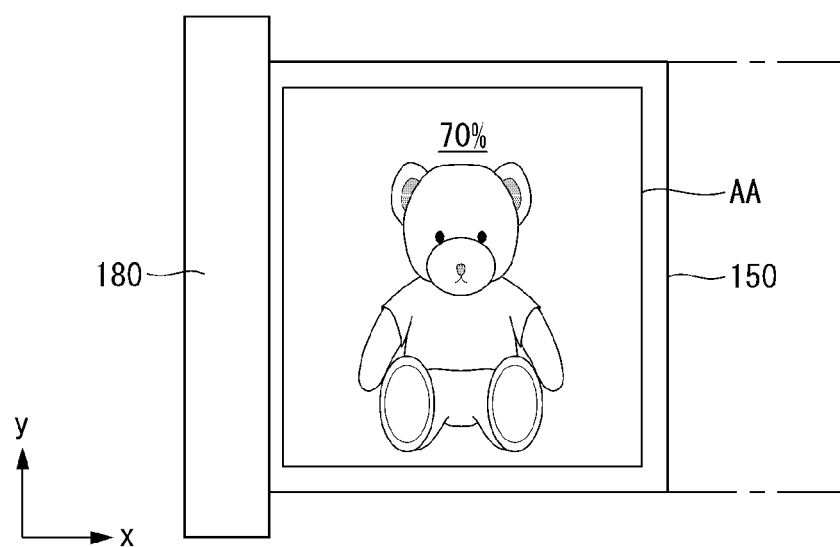

As illustrated in FIG. 6B, when the display panel 150 is 70% unrolled, an image is displayed at a resolution (low resolution) which is adjusted to be lower than the full resolution the display panel 150 can provide. However, the percentage of the unrolled portion of the display panel 150 is merely an example.

Figure 7A:
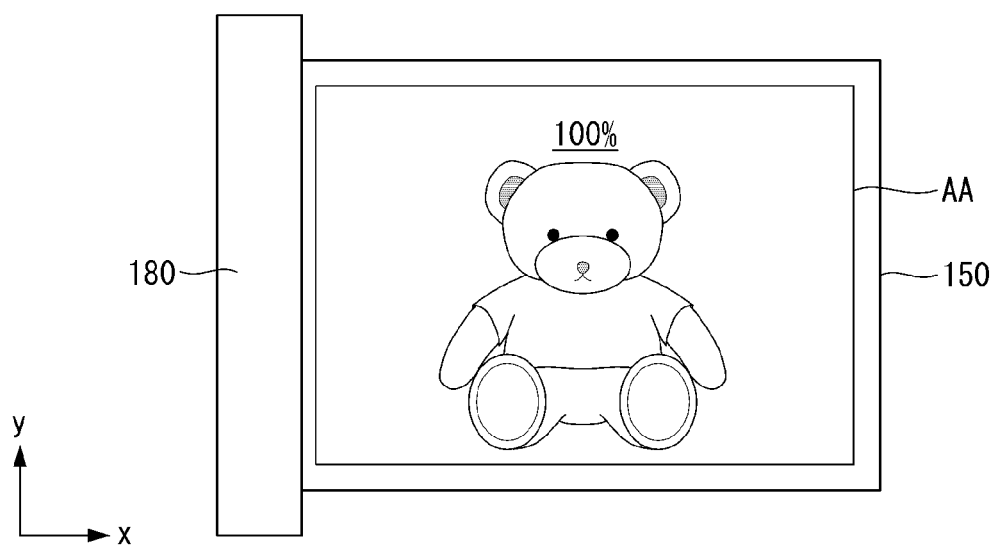
FIGS. 7A and 7B are views showing another aspect of the rollable flexible display device.

According to another aspect of the present disclosure, the rollable flexible display device may change the image being displayed, depending on the area (size or position) of the display panel 150 when unrolled. As illustrated in FIG. 7A, when the display panel 150 is fully unrolled, the display panel 150 may display an image (e.g., movie) being played in an application.

Figure 7B:
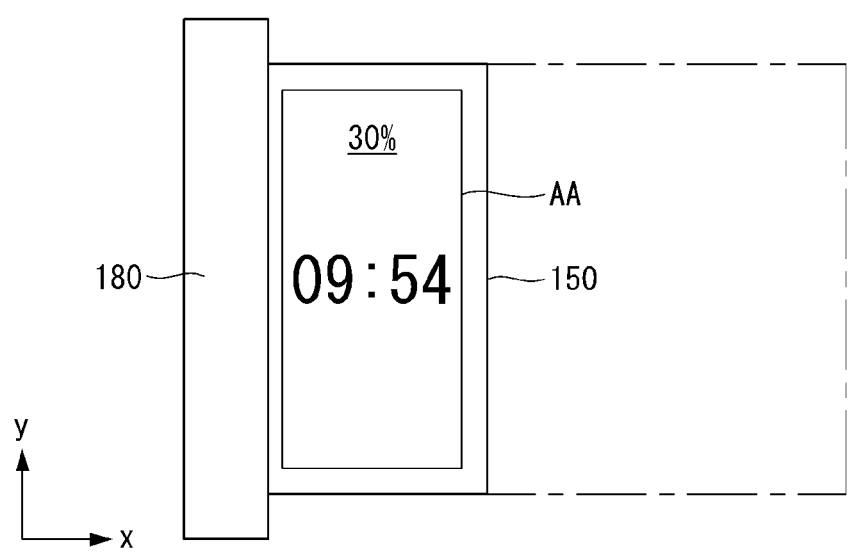

As illustrated in FIG. 7B, when the display panel 150 is 30% unrolled, the display panel 150 may pause an image being played in an application and display an internally-configured image (default view, e.g., the time). However, the percentage of the unrolled portion of the display panel 150 is merely an example.

Figure 8A:
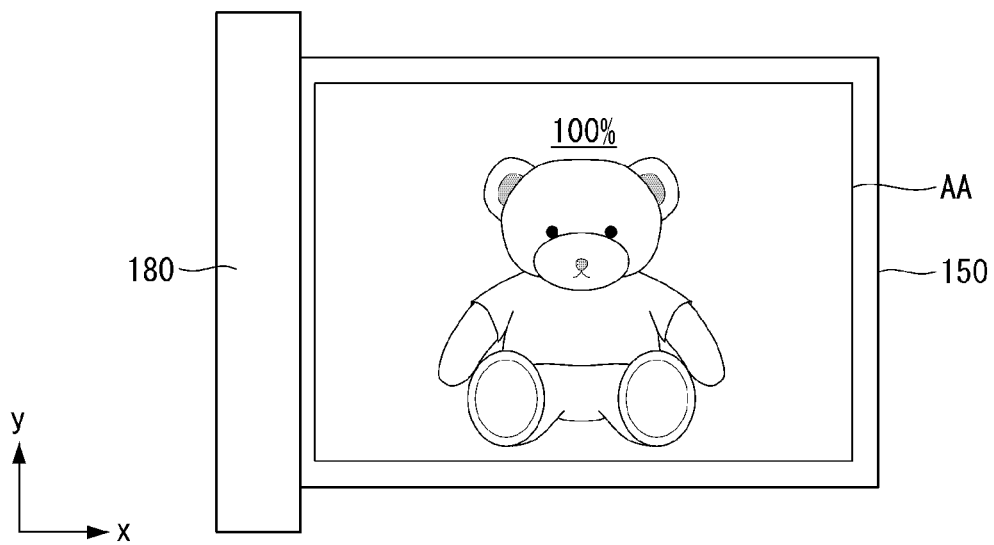
FIGS. 8A and 8B are views showing still another aspect of the rollable flexible display device.

According to still another aspect of the present disclosure, the rollable flexible display device may vary the operating frequency of the image being displayed, depending on the area (size or position) of the display panel 150 when unrolled. As illustrated in FIG. 8A, when the display panel 150 is fully unrolled, the display panel 150 may be driven at a normal operating frequency or fast operating frequency (e.g., 50 to 240 Hz) set for the device to display the image.

Figure 8B:
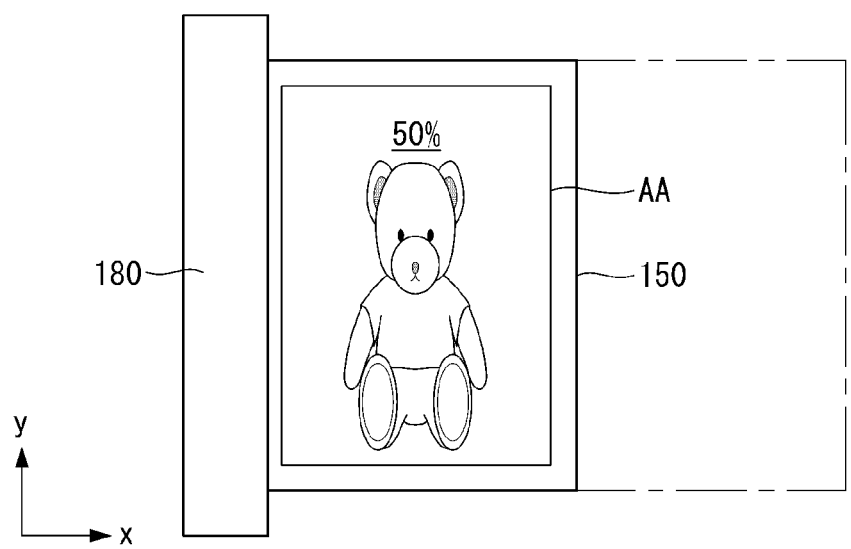

As illustrated in FIG. 8B, when the display panel 150 is 50% unrolled, the display panel 150 may be driven at a power-saving operating frequency (e.g., 1 to 30 Hz) set for the device to display the image.

Besides, the rollable flexible display device according to the present disclosure may change the driving scheme as well as the image by incorporating various functions, including varying brightness up and down depending on the ratio between the rolled portion and unrolled portion of the display panel 150.

Exemplary aspects for implementing the rollable flexible display device as above will be described below.

Figure 9:
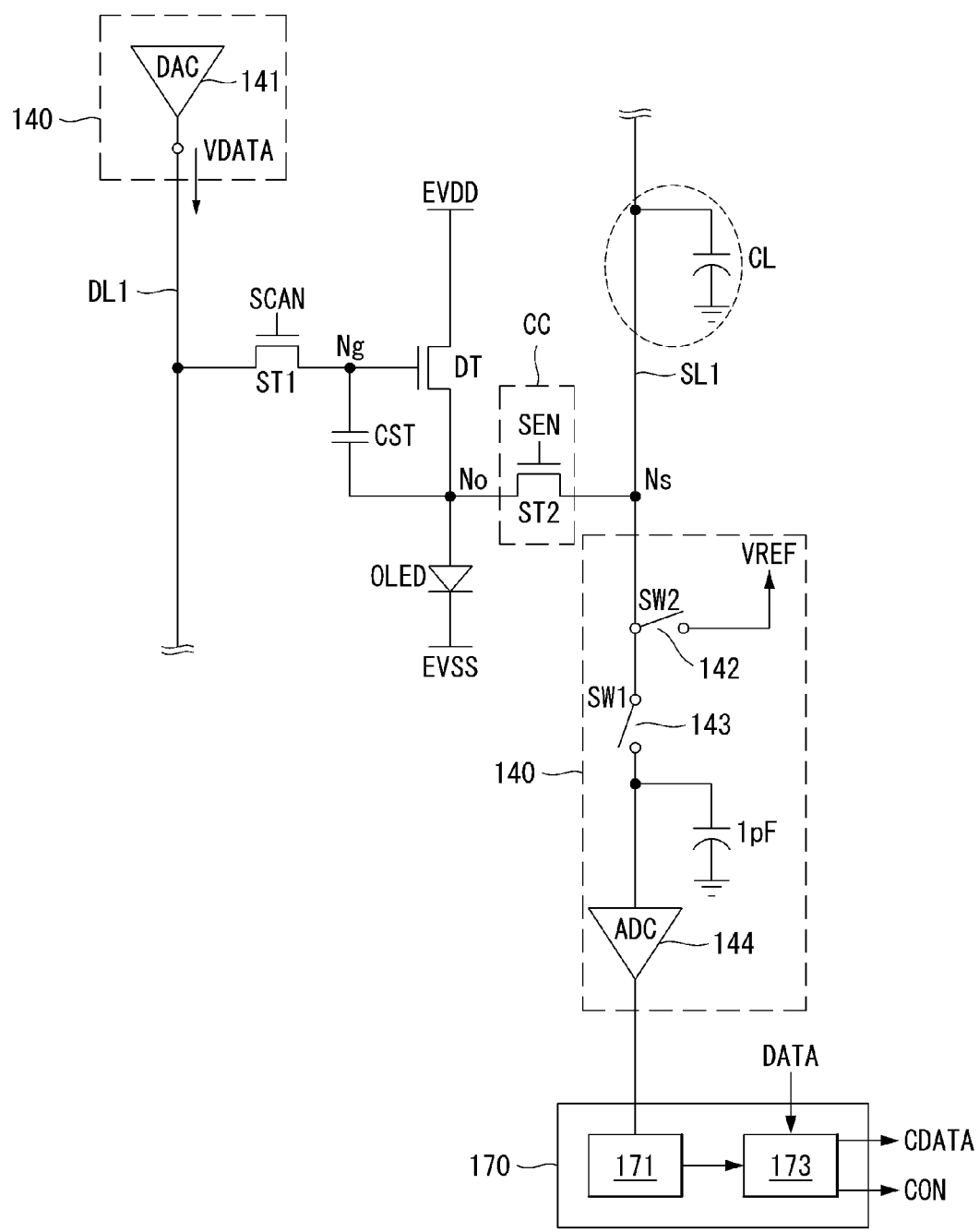
FIG. 9 is a circuit diagram explaining a rollable flexible display device according to an aspect of the present disclosure.
Figures 11A, 11B, 11C:
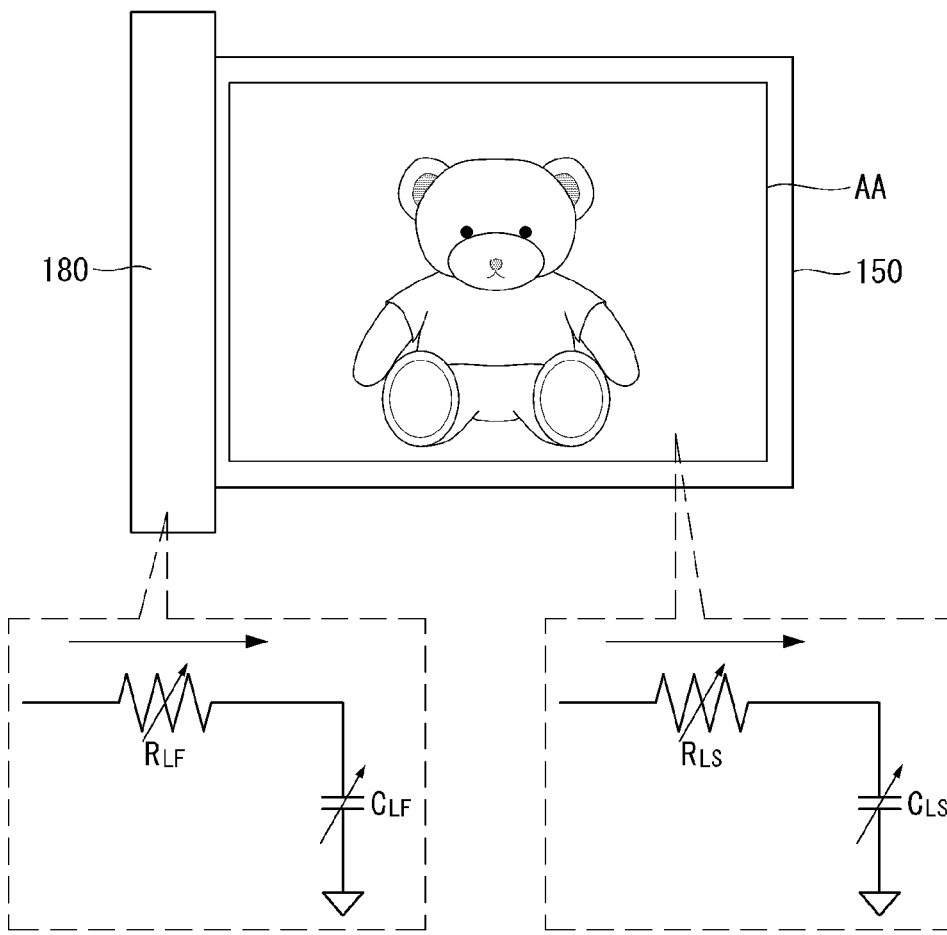
FIGS. 11A, 11B and 11C are diagrams explaining an RC difference between rolled and unrolled portions of the display panel.
Figure 12:
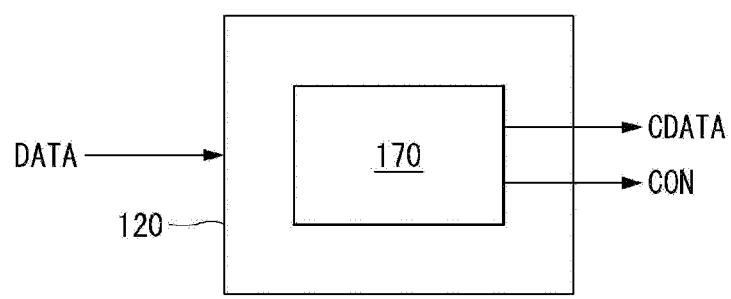
FIG. 12 is a block diagram showing a timing controller having a device adjusting part.
Figure 13:
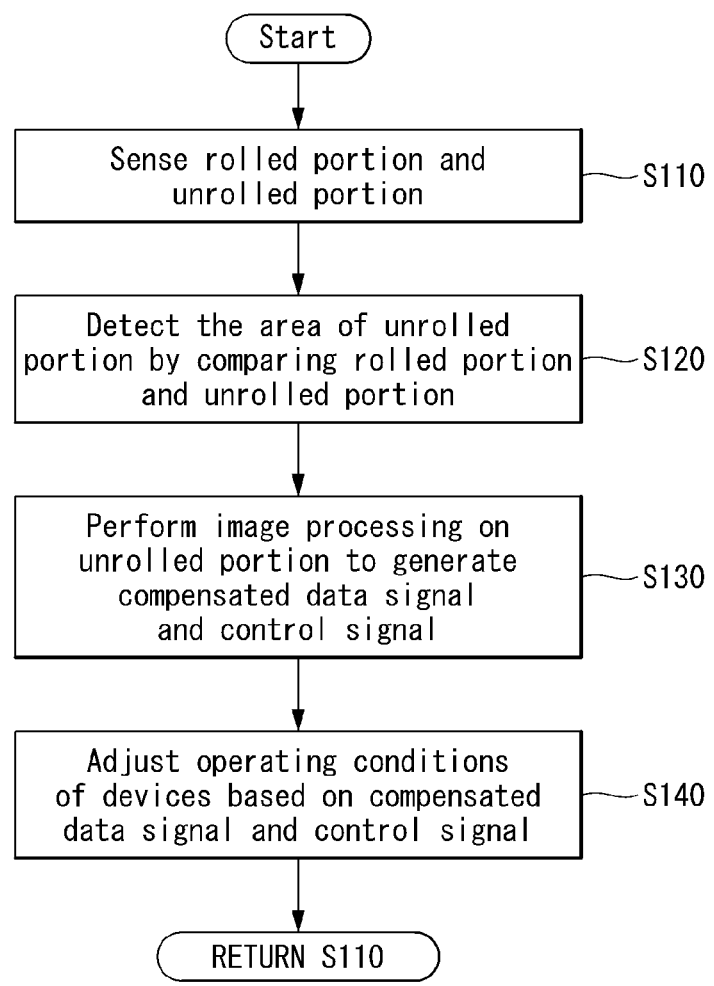
FIG. 13 is a flowchart explaining a method of driving the rollable flexible display device according to an aspect of the present disclosure.

FIG. 9 is a circuit diagram explaining a rollable flexible display device according to an aspect of the present disclosure. FIG. 10 is a diagram explaining a change in resistance caused by tensile strain. FIG. 11 is a diagram explaining an RC difference between rolled and unrolled portions of the display panel. FIG. 12 is a block diagram showing a timing controller having a device adjusting part. FIG. 13 is a flowchart explaining a method of driving the rollable flexible display device according to an aspect of the present disclosure.

As illustrated in FIG. 9, the rollable flexible display device according to an aspect comprises a subpixel SP having a compensation circuit CC.

The subpixel SP having the compensation circuit CC comprises a storage capacitor CST, a switching transistor ST1, a driving transistor DT, a compensation transistor ST2, and an organic light-emitting diode OLED. The connections between the elements included in the subpixel SP and their functions will be schematically explained below.

The switching transistor ST1 has a gate electrode connected to a first scan line SCAN, a first electrode connected to a first data line DL1, and a second electrode connected to a gate electrode of the driving transistor DT. The switching transistor ST1 acts as a switch between the first data line DL1 and a first node Ng to which the storage capacitor CST is connected, so as to store a data voltage in the storage capacitor CST.

The driving transistor DR has a gate electrode connected to the second electrode of the switching transistor ST1, a first electrode connected to a first potential voltage line EVDD, and a second electrode connected to an anode of the organic light-emitting diode OLED. The driving transistor DT serves to supply drive current to the organic light-emitting diode OLED.

One end of the storage capacitor CST is connected to the gate electrode of the driving transistor DT, and the other end is connected to the second electrode of the driving transistor DT. The storage capacitor CST serves to store a data signal as a data voltage.

The anode of the organic light-emitting diode OLED is connected to the second electrode of the driving transistor DT, and the cathode is connected to a second potential voltage line EVSS. The organic light-emitting diode OLED serves to emit light in response to drive current.

The compensation transistor ST2 has a gate electrode connected to a second scan line SEN, a first electrode connected to the anode of the organic light-emitting diode OLED and the second electrode of the driving transistor DT, and a second electrode connected to a first sensing line SL1. The compensation transistor ST2 acts as a switch between a second node No and a third node Ns so as to feed a reset voltage to the anode of the organic light-emitting diode OLED.

The circuit configuration of the subpixel SP described above is merely an example, and the present disclosure is not limited to this example. One or more of the transistors ST1, DT, and ST2 included in the subpixel SP may be configured as a P-type rather than an N-type. Besides the illustrated transistors ST1, DT, and ST2, the subpixel SP may further comprise transistors or capacitors that perform other functions. It should be understood that the source and drain electrodes of the transistors have been described as first and second electrodes or as second and first electrodes in the above description, because the transistors may be configured as an N-type or a P-type.

As illustrated in FIG. 9, the rollable flexible display device according to the first exemplary aspect of the present disclosure comprises a data driver 140 capable of outputting a data signal to the subpixel SP and sensing the subpixel SP.

The data driver 140 comprises an output circuit 141 outputting a data signal to the subpixel SP and sensing circuits (SL1) 142 to 144 capable of sensing the subpixel SP in order to compensate for the data signal.

The output circuit 141 comprises a digital-analog converter circuit DAC capable of converting a digital data signal into an analog data signal VDATA. An output terminal of the output circuit 141 is connected to the first data line DL1. The data driver 140 may comprise the same number of output circuits 141 as data lines.

The sensing circuits 142 to 144 comprise a voltage output circuit 142, a sampling circuit 143, and an analog-digital converter circuit 144. The voltage output circuit 142 serves to output a reset voltage generated by a voltage source VREF through the first sensing line SL1 and a precharge voltage through the first data line DL1. The reset voltage generated by the voltage source VREF and the precharge voltage are generated at a voltage level between a first potential voltage and a second potential voltage. The precharge voltage and the reset voltage may be set to be similar or equal.

The sensing circuits 142 to 144 comprise a subpixel SP and sensing lines such as the first sensing line SL1 connected to the subpixel SP. In some cases, the sensing circuits 142 to 144 may further comprise data lines such as the first data line DL1 connected to the subpixel SP.

Voltages output through the first sensing line SL1 and the first data sensing line DL1 are separated into two types: the reset voltage and the precharge voltage, because these voltages play different roles depending on the input position.

The voltage output circuit 142 stops operating when the sampling circuit 143 provides a threshold voltage value of the organic light-emitting diode OLED to the analog-digital converter circuit 144. That is, the voltage output circuit 142 operates only when it outputs the reset voltage and the precharge voltage. Although the voltage output circuit 142 is illustrated as having only the switch SW2 and the voltage source VREF, the present disclosure is not limited to this.

The sampling circuit 143 serves to sense the subpixel SP through the first sensing line SL1. The sampling circuit 143 senses a threshold voltage value of the organic light-emitting diode OLED, a threshold voltage value of the driving transistor DT, or parasitic values of the first sensing line SL1, and then sends the sensed value to the analog-digital converter circuit 144. Although the sampling circuit 143 is illustrated as having the form of a switch SW1, the present disclosure is not limited to this and the sampling circuit 143 may be implemented as an active element and a passive element.

The analog-digital converter circuit 144 receives a sensed value from the sampling circuit 143 and converts the analog voltage value into a digital voltage value. The analog-digital converter circuit 144 sends the digitized sensed value to a device adjusting part 170.

As illustrated in FIGS. 9 and 10, the rollable flexible display device according to an aspect of the present disclosure comprises the device adjusting part 170. The equation in FIG. 10 is provided to help understanding of a change in resistance caused by tensile strain.

The device adjusting part 170 compensates for an externally supplied data signal DATA based on sensed values provided by the data driver 140 to generate a compensated data signal CDATA and at the same time a control signal CON for varying or adjusting the driving schemes of various devices.

The device adjusting part 170 comprises a determiner 171 and an adjustor 173. The determiner 171 determines whether or how much the organic light-emitting diode OLED or driving transistor DT is degraded, based on sensed values provided by the data driver 140. For example, the determiner 171 may determine whether or how much the elements included in the subpixel SP are degraded by a comparison between test values (comparison values) in an internal lookup table and sensed values (measured values) obtained by sensing, but the present disclosure is not limited to this. The determiner 171 may detect changes caused by degradation of the elements in the subpixel SP by the comparison process and provide them to the adjustor 173.

Moreover, the determiner 171 determines whether or how much the shape of the display panel is deformed, based on sensed values provided by the data driver 140. The determiner 171 may extract the parasitic resistance RL and parasitic capacitance CL existing in the first sensing line SL1 from the sensed values, and determine whether and how much the shape of the display panel is deformed, based on changes in the parasitic values.

For example, the determiner 171 may determine whether or how much the shape of the display panel is deformed by a comparison between test values (comparison values) in an internal lookup table and sensed values (measured values) obtained by sensing, but the present disclosure is not limited to this. The determiner 171 may detect changes caused by deformation of the shape of the display panel by the comparison process and provide them to the adjustor 173.

Referring to FIGS. 9 to 11C, the determination of whether or how much the shape of the display panel is deformed will be further explained below.

The area or length of the first sensing line SL1 changes when a tensile strain is applied. The change in length causes a change in parasitic resistance RL existing in the first sensing line SL1. Thus, by measuring the parasitic resistances RLF and RLS of the rolled portion (FIG. 11B) and unrolled portion (FIG. 11C) of the display panel 150 and providing these values as test values (comparison values) in the lookup table, it is possible to determine whether or how much the shape of the display panel is deformed, when sensed values are input later.

Likewise, if M sensing lines (M is an integer of 2 or greater), as well as the first sensing line SL1, are provided on the display panel 150 and they overlap, the parasitic capacitance CL existing in the first sensing line SL1 changes too. Thus, by measuring the parasitic capacitances CLF and CLS of the rolled portion (a of FIG. 11A) and unrolled portion (b of FIG. 11B) of the display panel 150 and providing these values as test values (comparison values) in the lookup table, it is possible to determine whether or how much the shape of the display panel is deformed, when sensed values are input later.

Thus, by extracting the parasitic resistances RLF and RLS and parasitic capacitances CLF and CLS existing in the first sensing line SL1 separately from the sensed values, depending on the state of the display panel 150, it is possible to determine more accurately whether or how much the shape of the display panel 150 is deformed, based on changes in the parasitic values.

On the contrary, the parasitic values RLF and CLF of the rolled portion (FIG. 11B) of the display panel 150 and the parasitic values RLS and CLS of the rolled portion (FIG. 11C) vary depending on the shape of the display panel 150. Therefore, deformation of the shape of the display panel 150 may be detected by sensing the two values and comparing them.

The adjustor 173 compensates for an input data signal DATA based on changes provided by the determiner 171 and generates and outputs a compensated data signal CDATA. Moreover, the adjustor 173 generates a control signal CON for controlling or adjusting (varying) the driving schemes of various devices based on the changes provided by the determiner 171. The control signal CON output from the adjustor 173 may be used as a signal for controlling or adjusting (varying) various devices, for example, the timing controller, the data driver, a gamma part, and a power supply part.

As illustrated in FIG. 12, the device adjusting part 170 may be included within the timing controller 120. On the other hand, either the determiner 171 or adjusting part 173 included in the device adjusting part 170 may be included in other devices (for example, the determiner may be included in the data driver).

Hereinafter, a method of driving the rollable flexible display device according to an aspect of the present disclosure will be described with reference to FIG. 13.

The rolled portion and unrolled portion of the display panel are sensed (S110). Next, the area of the unrolled portion may be detected by comparing the rolled portion and unrolled portion of the display panel (S120). Next, image processing is performed on the unrolled portion of the display panel to thereby generate a compensated data signal and a control signal (S130). Next, the operating conditions of devices are adjusted based on the compensated data signal and the control signal (S140).

The compensated data signal may only refer to a data signal that is supplied to the unrolled portion of the display panel. This is because degradation occurs only in the unrolled portion of the display panel, whereas no degradation occurs in the rolled portion of the display panel where no image is displayed.

As explained with reference to FIGS. 9 to 13, in the aspect of the present disclosure, the rolled and unrolled portions of the display panel 150 and the area of the unrolled portion may be detected based on the configuration described above. Moreover, in the aspect of the disclosure, image processing is performed on the unrolled portion of the display panel 150 based on the configuration described above to thereby generate a compensated data signal CDATA and a control signal CON. Additionally, in the aspect of the disclosure, the operating conditions of devices may be adjusted based on the compensated data signal CDATA and the control signal CON.

The aspect of the disclosure enables implementation of a sensing circuit without the need for a separate sensor by incorporating a configuration and algorithm for detecting the rolled and unrolled portions of the display panel 150 and the area of the unrolled portion into external compensation technology, thereby reducing the manufacturing costs of devices.

The method and configuration of sensing the rolled and unrolled portions of the display panel, described in FIG. 13, may be based on the aspect explained with reference to FIGS. 9 to 11, but the present disclosure is not limited thereto, and they may be based on other aspects explained below.

Figure 14:
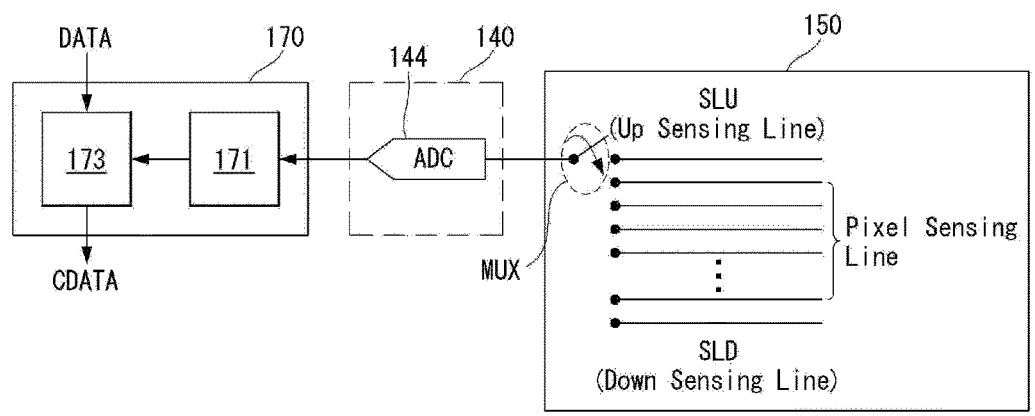
FIG. 14 is a circuit diagram explaining a rollable flexible display device according to another aspect of the present disclosure
Figure 15:
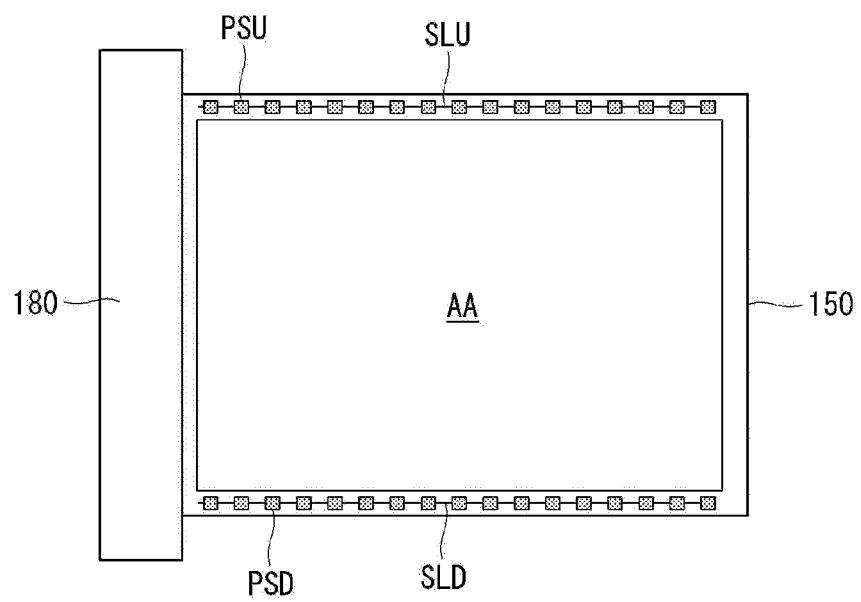
FIG. 15 is an illustration of a sensing circuit disposed on the display panel.
Figure 16A:
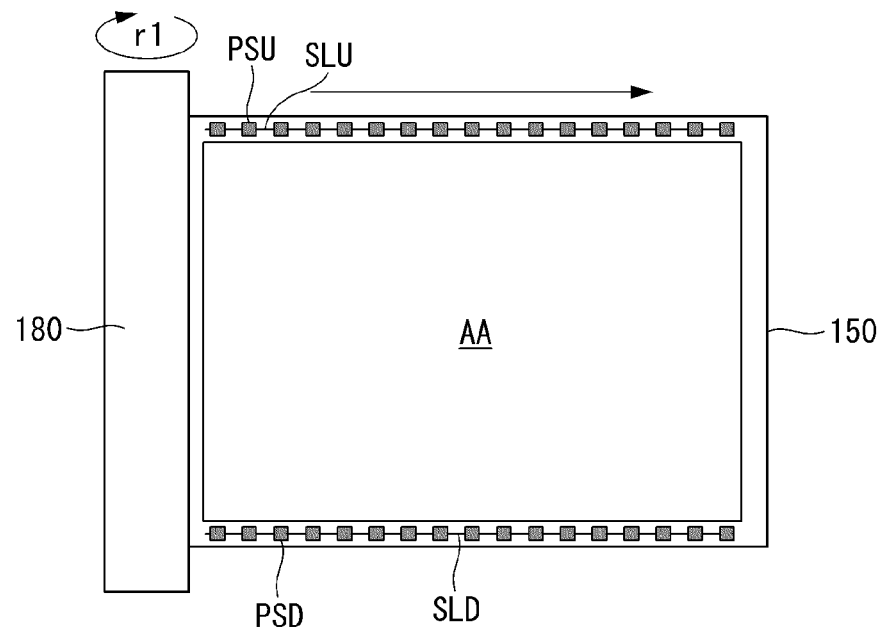
FIGS. 16A and 16B are diagrams explaining a method of driving the rollable flexible display device according to another aspect of the present disclosure.
Figure 16B:
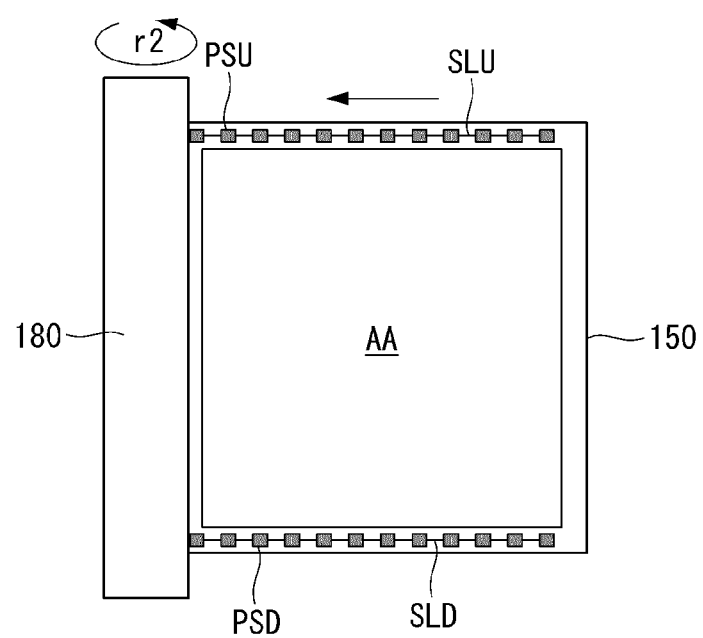

FIG. 14 is a circuit diagram explaining a rollable flexible display device according to another aspect of the present disclosure. FIG. 15 is an illustration of a sensing circuit disposed on the display panel. FIGS. 16A and 16B are diagrams explaining a method of driving the rollable flexible display device according to another aspect of the present disclosure.

As illustrated in FIG. 14, the rollable flexible display device according to another aspect of the present disclosure comprises a display panel 150, a data driver 140, and a device adjusting part 170. Sensing lines SLU and SLD and a multiplexer MUX are disposed on the display panel 150. The sensing lines SLU and SLD may be disposed in, but not limited to, a non-display area of the display panel 150.

The sensing lines SLU and SLD are disposed in such a manner as to sense every horizontal or vertical line on the display panel 150. The sensing lines SLU and SLD are used as lines for sensing the pixels (or subpixels) on the display panel 150.

The multiplexer MUX performs a switching operation to connect the analog-digital converter circuit 144 of the data driver 140 and the sensing lines SLU and SLD of the display panel 150 by a time-division system, in response to a selection signal output from the data driver 140, etc. By this operation, the data driver 140 may sense the display panel 150.

Parasitic resistance and parasitic capacitance as explained in the first exemplary aspect exist in the sensing lines SLU and SLD. There are differences in these parasitic values between rolled and unrolled portions of the display panel 150. Therefore, deformation of the shape of the display panel 150 may be detected by sensing the parasitic values and comparing them.

As illustrated in FIGS. 14 to 16B, sensing lines SLU and SLD and sensors PSU and PSD are disposed on the display panel 150. The sensing lines SLU and SLD and the sensors PSU and PSD are included in the sensing circuit.

The sensing lines SLU and SLD comprise an upper sensing line SLU disposed in an upper non-display area (or an upper display area) of the display panel and a lower sensing line SLD disposed in a lower non-display area (or a lower display area) of the display panel 150.

The sensors PSU and PSD comprise upper sensors PSU disposed on an upper portion of the display panel 150 and lower sensors PSD disposed on a lower portion of the display panel 150. When the sensors PSU and PSD are disposed in the display area, they may be embedded in the subpixels on the display panel 150. By contrast, when the sensors PSU and PSD are disposed in the non-display area, holes for receiving external light may be disposed in a structure covering the non-display area.

The sensors PSU and PSD are arranged at uniform intervals on the upper and lower portions of the display panel 150. The upper sensing line SLU is electrically connected to the upper sensors PSU. The lower sensing line SLD is electrically connected to the lower sensors PSD.

Light sensors or illumination sensors capable of sensing light or pressure sensors capable of sensing pressure may be selected as the sensors PSU and PSD. If the sensors PSU and PSD are light sensors or illumination sensors, they may sense the unrolled portion of the display panel 150 by the amount of light entering and received through the unrolled portion of the display panel 150. On the other hand, if the sensors PSU and PSD are pressure sensors, they may sense the rolled portion of the display panel 150 by a change in pressure on the rolled portion of the display panel 150. The following description will be given of light sensors which are implemented as oxide transistors (TFTs).

The sensing lines SLU and SLD electrically connect the sensors PSU and PSD and the analog-digital converter circuit 144 of the data driver 140. As explained earlier, the sensing lines SLU and SLD are connected to the analog-digital converter circuit 144 of the data driver 140 by the multiplexer MUX by a time-division method.

While the sensors PSU and PSD positioned in the rolled portion of the display panel 150 cannot receive light, the sensors PSU and PSD located in the unrolled portion of the display panel 150 can receive light. Thus, it is possible to detect whether the shape of the display panel 150 is deformed or not by sensing each portion individually by the sensors PSU and PSD and comparing the presence or absence of light received in the rolled and unrolled portions.

The device adjusting part 170 comprises a determiner 171 and a adjustor 173. The determiner 171 determines whether the shape of the display panel 150 is deformed or not, based on sensed values provided by the data driver 140. The adjustor 173 compensates for an external input data signal DATA based on whether the shape of the display panel 150 is deformed or not, to generate a compensated data signal CDATA and at the same time a control signal CON for varying or adjusting the driving schemes of various devices.

In this way, using the sensing lines SLU and SLD and the sensors PSU and PSD together, it is possible to determine more accurately whether the shape of the display panel 150 is deformed or not. When the sensing lines SLU and SLD and the sensors PSU and PSD are used together, parasitic values of the sensing lines SLU and SLD may or may not be used for higher accuracy.

As explained with reference to FIGS. 14 to 16B, in another aspect of the disclosure, the rolled and unrolled portions of the display panel 150 and the area of the unrolled portion may be detected based on the configuration described above. Moreover, in another aspect, image processing is performed on the unrolled portion of the display panel 150 based on the configuration described above to thereby generate a compensated data signal CDATA and a control signal CON. Additionally, in another aspect, the operating conditions of devices may be adjusted based on the compensated data signal CDATA and the control signal CON.

In another aspect, sensing lines and sensors may be formed in a gate-in-panel manner, and a configuration and algorithm for detecting the rolled and unrolled portions of the display panel 150 and the area of the unrolled portion may be incorporated. By implementing sensors on the display panel in a gate-in-panel manner, the cost of device implementation can be reduced.

Figure 17:
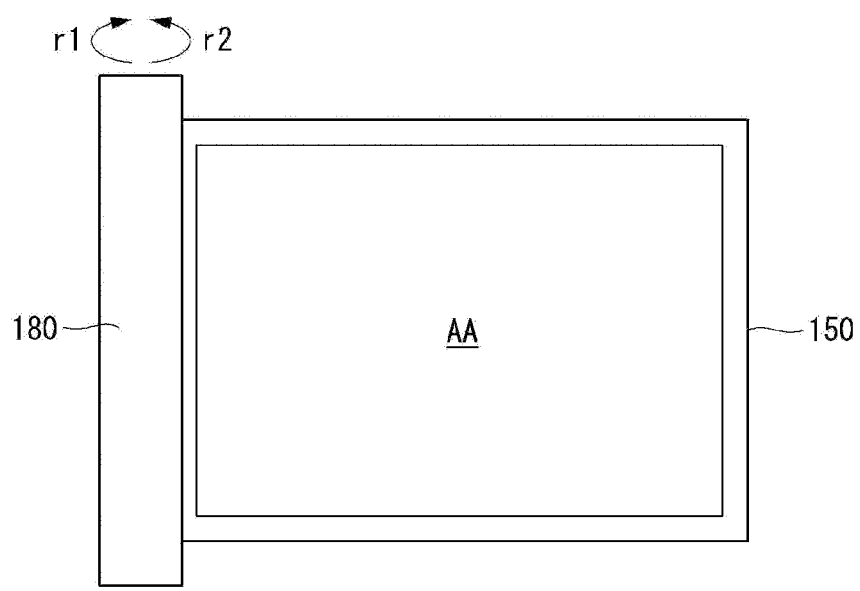
FIG. 17 is a diagram explaining a rollable flexible display device according to still another aspect of the present disclosure.
Figure 18:
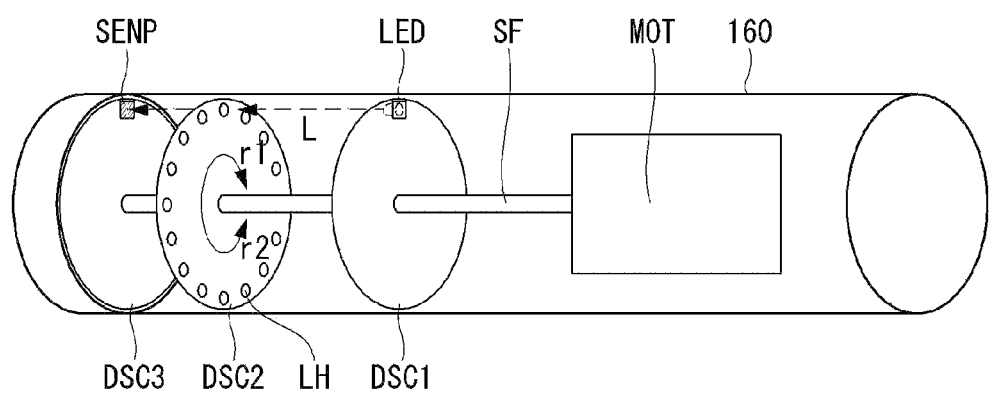
FIG. 18 is a diagram explaining a structure for implementing FIG. 17.
Figure 19:
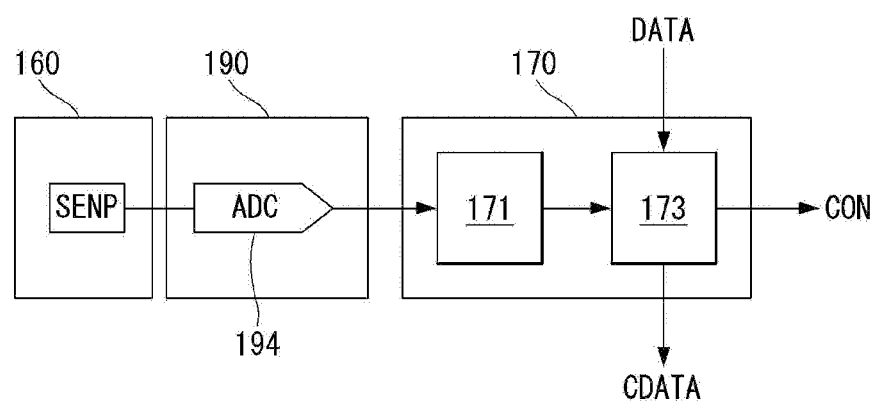
FIG. 19 is a circuit diagram explaining the rollable flexible display device according to still another aspect of the present disclosure.
Figure 20A:
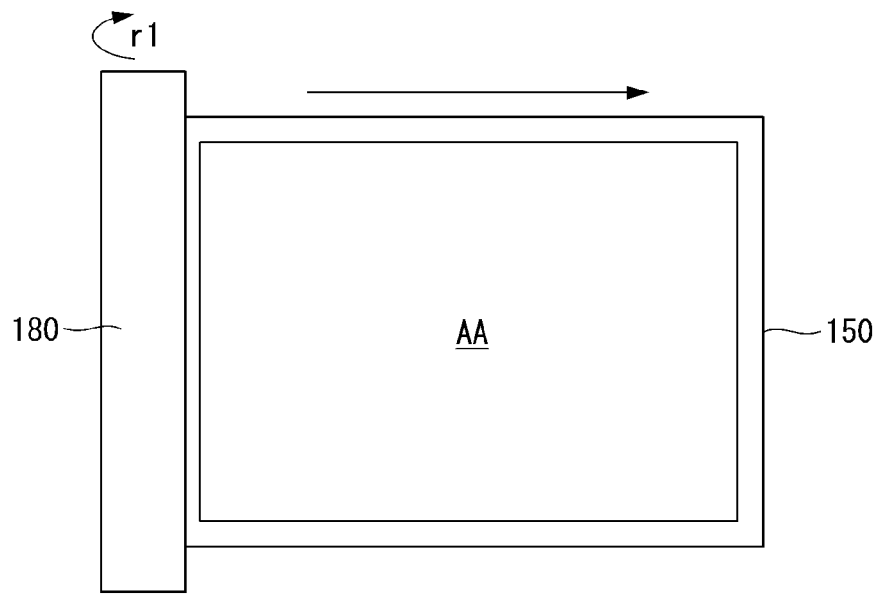
FIGS. 20A and 20B are diagrams explaining a method of driving the rollable flexible display device according to still another aspect of the present disclosure.

FIG. 17 is a diagram explaining a rollable flexible display device according to still another aspect of the present disclosure. FIG. 18 is a diagram explaining a structure for implementing FIG. 17. FIG. 19 is a circuit diagram explaining the rollable flexible display device according to still another aspect of the present disclosure. FIG. 20 is a diagram explaining a method of driving the rollable flexible display device according to still another aspect of the present disclosure.

As illustrated in FIG. 17, the rollable flexible display device according to still another aspect of the present disclosure detects the direction and amount of rotation of the panel roller part or display panel 150, and determines rolled and unrolled portions of the display panel 150 based on the detected direction and amount of rotation.

A mechanical or electronic means or a combination of both may be used to detect the direction and amount of rotation of the display panel 150. For example, when the combination of mechanical and electronic means is used, the direction and amount of rotation of a disc (or wheel) caused by user operation (or wind-up mechanism) may be detected, and the rolled and unrolled portions of the display panel 150 may be determined based on the detected direction and amount of rotation.

In another example, when the combination of mechanical and electronic means is used, the direction and amount of rotation of a disc generated by the rotation of a motor may be detected, and the rolled and unrolled portions of the display panel 150 may be determined based on the detected direction and amount of rotation.

While the third exemplary aspect will be described below with an example of the combination of mechanical and electronic means, the means for detecting the direction and amount of rotation of the display panel 150 and its position are not limited to this example.

As illustrated in FIGS. 17 and 18, the rollable flexible display device according to still another aspect of the present disclosure uses internal components of the panel roller part 160 in order to detect the direction and amount of rotation of the display panel 150. However, some of the components explained below may be included inside or outside the housing 180 accommodating the panel roller part 160.

A motor part MOT and discs DSC1 to DSC3 are included inside the panel roller part 160. The motor part MOT provides torque to allow the panel roller part 160 to rotate in a first direction or in a second direction opposite to the first direction, in response to an externally supplied signal and power.

A light emitter and a light receiver for detecting the direction and amount of rotation of the panel roller part 160 generated by the rotation of the motor part MOT may be disposed on some of the discs DSC1 to DSC3. One or more light emitters and light receivers may be provided.

For example, the discs DSC1 to DSC3 comprise a first disc DSC1 having a light-emitting diode LED, a second disc DSC2 having transmission holes LH for passing light through, and a third disc DSC3 having a light receiving sensor SENP.

The transmission holes LH comprise first transmission holes (e.g., circles) and second transmission holes (e.g., rectangles along the direction of rotation of the disc) which have different shapes. One or more first and second transmission holes are arranged at intervals in the second disc DSC2.

In this case, when the second disc DSC2 rotates in the first direction and light transmitted through two of the first transmission holes is received by the sensor SENP, the rotation may be labeled as right rotation. By contrast, when the second disc DSC2 rotates in the second direction and light transmitted through one (or two) of the second transmission holes is received by the sensor SENP, the rotation may be labeled as left rotation. This is because the amount of light transmitted through a first transmission hole and the amount of light transmitted through a second transmission hole are different.

In contrast, the transmission holes LH may be identical in shape and their exposed area (or open area) may become progressively larger from one side towards the other side. In this case, even if the transmission holes LH are identical in shape, the amount of light transmitted through them varies depending on the direction of rotation. As such, the direction of rotation of the disc may be detected. However, the method of detecting the direction of rotation using a light emitter and a light receiver is not limited to this.

A hole through which a shaft SF of the motor part MOT passes is disposed in the center of each of the first and third discs DSC1 and DSC3. A hole through which the shaft SF of the motor part MOT is fitted is disposed in the center of the second disc DSC2.

The second disc DSC2 rotates the panel roller part 160 as it rotates together with the motor part MOT. On the other hand, the first and third discs DSC1 and DSC3 are configured to be not affected by the rotation of the motor part MOT. To this end, a bearing or the like may be provided in the center of each of the first and third discs DSC1 and DSC3 and the shaft SF may be fitted to the bearings, but the present disclosure is not limited to this.

While the above description has been given of an example in which three discs are disposed inside the panel roller part 160, the present disclosure is not limited to this example. For example, the first and second discs DSC1 and DSC2 may be located inside the panel roller part 160 but may be integrated into a single unit with a light-emitting diode LED.

In this case, transmission holes through which light emitted from the light-emitting diode LED can exit are disposed at the end of the panel roller part 160.

With this configuration, the integrated disc and the panel roller 160 rotate together within the housing 180, in response to the rotation of the motor part MOT. The third disc DSC3 receives light emitted from the rotating integrated disc and detects the direction and amount of rotation of the panel roller part 160.

However, as explained above, the structure and configuration for detecting the direction and amount of rotation of the panel roller part 160 may vary, and the present disclosure is not limited to the above structure and configuration.

Figure 20B:
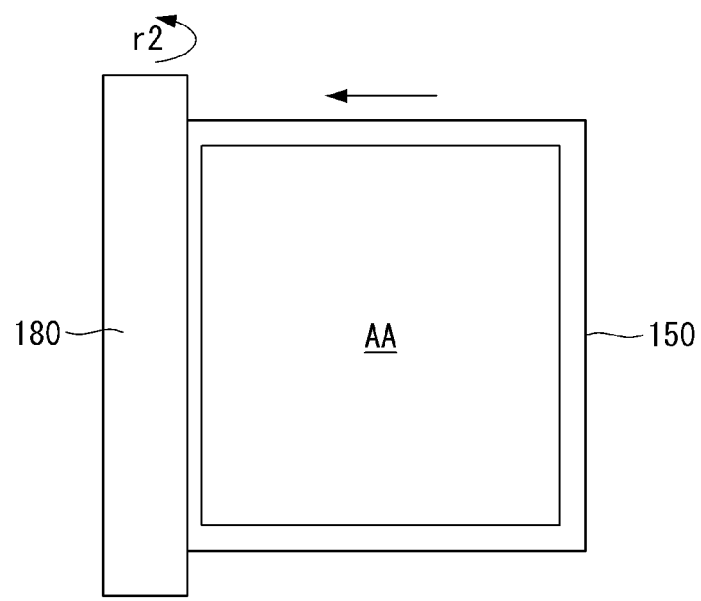

As illustrated in FIGS. 19 and 20B, the rollable flexible display device according to still another aspect of the present disclosure comprises a sensor SENP, a sensing circuit 190, and a device adjusting part 170.

The sensor SENP is disposed inside or outside the panel roller part 160. The sensor SENP detects sensed values including the direction and amount of rotation of the panel roller part 160. The sensor SENP may be configured in, but not limited to, the configuration and structure (comprising a light emitter and a light receiver) explained above with reference to FIG. 18.

The sensing circuit 190 has an analog-digital converter circuit 194. The analog-digital converter circuit 194 converts an analog sensed value sent from the sensor SENP into a digital sensed value and outputs it.

The device adjusting part 170 comprises a determiner 171 and a adjustor 173. The determiner 171 determines the direction and amount of rotation of the panel roller part 160, based on sensed values provided by the sensing circuit 190. The adjustor 173 compensates for an external input data signal DATA based on the direction and amount of rotation of the panel roller part 160, to generate a compensated data signal CDATA and at the same time a control signal CON for varying or adjusting the driving schemes of various devices.

As explained with reference to FIGS. 9 to 13, in still another aspect, the rolled and unrolled portions of the display panel 150 and the area of the unrolled portion may be detected based on the configuration described above. Moreover, in still another aspect, image processing is performed on the unrolled portion of the display panel 150 based on the configuration described above to thereby generate a compensated data signal CDATA and a control signal CON. Additionally, in still another aspect, the operating conditions of devices may be adjusted based on the compensated data signal CDATA and the control signal CON.

Meanwhile, in the present disclosure, the above described aspects have been described separately. However, one or more of the above described aspects may be combined to improve the accuracy of detection and determination of the rolled and unrolled portions of the display panel 150.

As seen above, the present disclosure has the advantage of providing a rollable flexible display device that has a configuration and a structure capable of easily detecting rolled and unrolled portions of a display panel and the area of the unrolled portion. Another advantage of the present disclosure is that it provides a rollable flexible display device capable of accurately determining rolled and unrolled portions of the display panel and adjusting the operating conditions of devices based on the determination. A further advantage of the present disclosure is that it provides a rollable flexible display device capable of optimizing the resolution, operating frequency, and image being displayed, depending on the area of the unrolled portion of the display panel.

What is claimed is:

1. A rollable flexible display device comprising:
a display panel displaying an image and configured to be rolled or unrolled;
a panel roller part that includes a first disc having a light emitter, a second disc having transmission holes for passing light from the light emitter and a third disc having a light receiving sensor and senses rotational amount values and rotational direction values to detect rolled and unrolled portions of the display panel;
a sensing circuit configured to digitize the sensed rotational amount values and the rotational direction values and outputting the digitized sensed rotational amount values and the sensed digitized rotational direction values; and
a device adjusting part adjusting operating conditions of the display panel based on the sensed values obtained from the sensing circuit.

2. The rollable flexible display device of claim 1, wherein the device adjusting part varies at least one of resolution, operating frequency, and brightness of the display device.

3. The rollable flexible display device of claim 1, wherein the device adjusting part changes the displayed image based on a ratio of the rolled and unrolled portions of the display panel.

4. The rollable flexible display device of claim 1, wherein the device adjusting part performs image processing on the unrolled portion of the display panel to generate a compensated data signal and a control signal for adjusting the display device driving the display panel.

5. The rollable flexible display device of claim 4, wherein the device adjusting part comprises:
a determiner determining whether or how much a shape of the display panel is deformed, based on the sensed values; and
an adjustor generating the compensated data signal, which is obtained by compensating for an input data signal based on changes provided by the determiner, and the control signal for adjusting display device driving the display panel.

6. The rollable flexible display device of claim 5, wherein the determiner determines whether or how much the shape of the display panel is deformed by comparing test values in an internal lookup table and sensed values obtained by the sensing unit.

7. The rollable flexible display device of claim 5, wherein the determiner determines whether or how much organic light-emitting diodes and driving transistors in subpixels of the display panel are degraded, based on sensed values provided by a data driver.

8. The rollable flexible display device of claim 5, wherein the device adjusting part comprises:
a determiner determining based on the sensed values whether or how much a shape of the display panel is deformed; and
an adjustor generating the compensated data signal, which is obtained by compensating for an input data signal based on changes provided by the determiner, and the control signal for adjusting display device driving the display panel.

9. The rollable flexible display device of claim 8, wherein the determiner determines whether or how much the shape of the display panel is deformed by comparing test values in an internal lookup table and sensed values obtained by the sensing unit.

10. The rollable flexible display device of claim 1, wherein the sensing circuit comprises:
sensing lines located on the display panel; and
a multiplexer that performs a switching operation to connect the sensing lines and the sensing circuit by a time-division method.

11. The rollable flexible display device of claim 10, wherein the sensing circuit detects parasitic values through the sensing lines connected to subpixels of the display panel, and determines the rolled and unrolled portions of the display panel based on changes in the parasitic values.

12. The rollable flexible display device of claim 1, wherein the sensing circuit comprises:
sensing lines located on the display panel; and
sensors connected to the sensing lines.

13. The rollable flexible display device of claim 12, wherein the sensing lines and the sensors are located on upper and lower portions of the display panel.

14. The rollable flexible display device of claim 13, wherein the sensors include light sensors or illumination sensors capable of sensing light or pressure sensors capable of sensing pressure.

15. The rollable flexible display device of claim 1, wherein the panel roller part provides a mechanical structure to allow the display panel to roll and unroll around an outer circumferential surface.

16. The rollable flexible display device of claim 15, further comprising a housing accommodating the panel roller part.

17. The rollable flexible display device of claim 16, wherein the sensing circuit is disposed between the panel roller part and the housing.

18. The rollable flexible display device of claim 15, wherein the sensing circuit comprises an analog-digital converter circuit.

19. The rollable flexible display device of claim 1, further comprising a motor part providing torque to allow the panel roller part to rotate in different directions in response to externally supplied signal and power.

20. The rollable flexible display device of claim 1, when the second disc rotates in one direction when the light received by the light receiving sensor is transmitted through a first shape transmission hole of the transmission holes and rotates in an opposite direction when the light received by the light receiving sensor is transmitted through a second shape transmission hole of the transmission holes.

21. A rollable flexible display device, comprising:
a display panel displaying an image and configured to be rolled or unrolled;
a panel roller part that includes a first disc having a light emitter, a second disc having transmission holes for passing light from the light emitter and a third disc having a light receiving sensor, senses rotational amount values and rotational direction values to detect rolled and unrolled portions of the display panel and provides a mechanical structure to allow the display panel to be rolled and unrolled around an outer circumferential surface;
a sensing circuit configured to digitize the sensed rotational amount values and the rotational direction values and outputting the digitized sensed rotational amount values and the digitized sensed rotational direction values;
a device adjusting part adjusting operating conditions of the display panel based on the sensed values obtained from the sensing circuit; and
a housing accommodating the panel roller part.

22. The rollable flexible display device of claim 21, wherein the sensing circuit comprises an analog-digital converter circuit.

* * * * *